United States Patent
Kane et al.

(10) Patent No.: US 8,368,069 B2
(45) Date of Patent: Feb. 5, 2013

(54) ANTIFUSE STRUCTURE FOR IN LINE CIRCUIT MODIFICATION

(75) Inventors: Terence L. Kane, Hopewell Junction, NY (US); Michael P. Tenney, Hopewell Junction, NY (US); Yun-Yu Wang, Hoepwell Junction, NY (US); Keith Kwong Hon Wong, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/360,270

(22) Filed: Jan. 27, 2012

(65) Prior Publication Data

US 2012/0126366 A1 May 24, 2012

Related U.S. Application Data

(62) Division of application No. 12/574,926, filed on Oct. 7, 2009, now Pat. No. 8,125,048.

(51) Int. Cl.
*H01L 29/04* (2006.01)
*H01L 31/036* (2006.01)
(52) U.S. Cl. .......... 257/50; 257/530; 257/E23.147; 438/131; 438/467; 438/600

(58) Field of Classification Search .......... 438/131, 438/467, 600, 957; 257/E23.147, 530, 50
See application file for complete search history.

(56) References Cited

U.S. PATENT DOCUMENTS

| | | | |
|---|---|---|---|
| 5,298,784 | A | 3/1994 | Gambino et al. |
| 7,206,215 | B2 | 4/2007 | DeBoer et al. |
| 7,499,315 | B2 | 3/2009 | Lowrey et al. |
| 2007/0040276 | A1 | 2/2007 | Yang et al. |
| 2007/0059929 | A1 | 3/2007 | Cho et al. |
| 2008/0159042 | A1 | 7/2008 | Bertin et al. |

OTHER PUBLICATIONS

Mariko T. Takagi et al., "A Highly Reliable Metal-to-Metal Antifuse for High-Speed Field Programmable Gate Arrays", IEDM '93, Dec. 1993, pp. 31-34 IEEE.

*Primary Examiner* — Thien F Tran
(74) *Attorney, Agent, or Firm* — Cantor Colburn LLP; Ian MacKinnon

(57) ABSTRACT

An antifuse structure and methods of forming contacts within the antifuse structure. The antifuse structure includes a substrate having an overlying metal layer, a dielectric layer formed on an upper surface of the metal layer, and a contact formed of contact material within a contact via etched through the dielectric layer into the metal layer. The contact via includes a metal material at a bottom surface of the contact via and an untreated or partially treated metal precursor on top of the metal material.

2 Claims, 5 Drawing Sheets

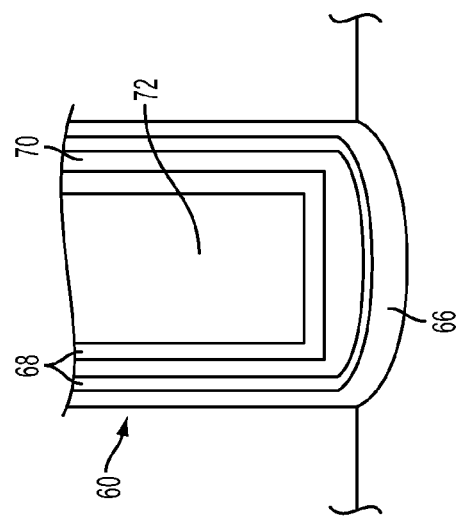
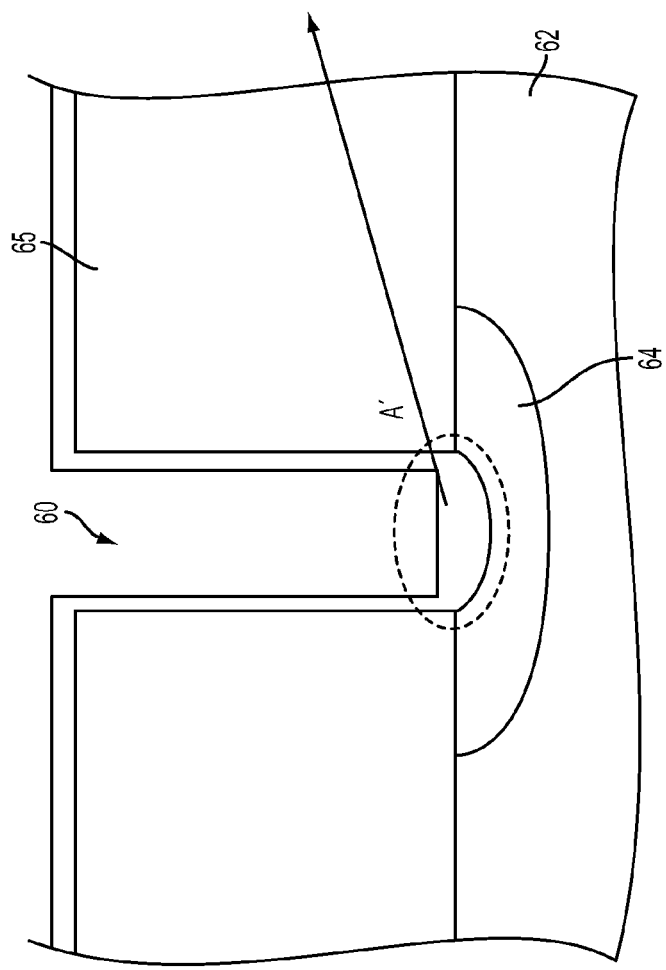
FIG. 5A
FIG. 5B

ANTIFUSE STRUCTURE FOR IN LINE CIRCUIT MODIFICATION

CROSS-REFERENCE TO RELATED APPLICATION

This application is a divisional of U.S. patent application Ser. No. 12/574,926, filed Oct. 7, 2009, the disclosure of which is incorporated by reference herein in its entirety.

BACKGROUND

The present invention relates to integrated circuit (IC) structures, and more specifically, to antifuses for in line circuit modification.

Fuses and antifuses have been used in integrated circuits for tailoring circuit parameters for optimal performance. Fuses increase the resistance of a circuit path when subjected to a programming current. Fuses typically include a fuse link and contact regions at both ends of the fuse link including a plurality of contacts of a uniformed size. The fuse has an underlying polycrystalline layer formed over a substrate and an overlying silicide layer. Fuses are "blown" by applying a voltage across the fuse structure. This voltage causes a current to flow and the structure to open, resulting in a permanent open circuit. Fuses are structures in which resistance is increased during programming and antifuses are structures in which resistance is decreased during programming.

Antifuses are structures that, when first fabricated, are an open circuit. When the antifuse is "fused," the open circuit becomes closed and conduction across the antifuse becomes possible. Thus, antifuses are used to perform the opposite function of a fuse. Typically an antifuse is fused by applying a sufficient voltage, called a "fusing voltage" across the antifuse structure. This voltage causes a current to flow and the structure to fuse together, resulting in a permanent electrical connection.

Each contact formed on the contact regions is typically formed by etching a contact via to a surface of the substrate and depositing a metal material such as titanium (Ti) and organic carrier material within the via to the surface of the substrate by a chemical vapor deposition (CVD) process thereby evaporating the organic material and leaving the metal material on the surface of the substrate. This process is performed at a temperature of approximately 400 degrees Celsius. The processing temperature may be too low to completely evaporate the organic material; therefore, the metal material and any residual carbon containing material are then treated by an N2/H2 plasma to break a bond of the metal material and the carbon containing material. During this treatment, hydrogen reacts with the carbon containing material thereby evaporating the residual carbon containing material and the nitrogen reacts with the metal material and leaves a metal precursor which acts a liner within the contact via. Contact material is then deposited within the contact via to form the contact.

SUMMARY

The present invention provides an antifuse structure including untreated metal precursor at a bottom surface of a contact via which remains in a high resistive state and becomes conductive upon applying a large programming current.

According to one embodiment of the present invention, an antifuse structure is provided. The antifuse structure includes a substrate having an overlying metal layer, a dielectric layer formed on an upper surface of the metal layer, and a contact formed of contact material within a contact via etched through the dielectric layer into the metal layer. The contact via includes a metal material at a bottom surface of the contact via and an untreated or partially treated metal precursor on top of the metal material.

According to another embodiment of the present invention, an antifuse structure is provided. The antifuse structure includes a substrate having an overlying metal layer, a dielectric layer formed on an upper surface of the metal layer, a trench formed in the metal layer and filled with a metal material and an untreated or partially treated metal precursor on top of the metal material, and a plurality of contacts formed within contact vias etched to a top of the trench and contacting the untreated or partially treated metal precursor.

According to yet another embodiment of the present invention, an antifuse structure is provided. The antifuse structure includes a substrate having an overlying metal layer, a plurality of contacts formed to the metal layer, and a tunnel formed between the plurality of contacts and filled with an untreated or partially treated metal precursor.

According to another embodiment of the present invention, a method for forming contacts of an antifuse structure is provided. The method includes etching a contact via into a metal layer overlying a substrate, depositing metal material at a bottom surface of the contact via and an untreated or partially treated metal precursor on top of the metal material, and depositing contact material within the contact via to form a contact.

According to another embodiment of the present invention, a method for forming contacts of an antifuse structure is provided. The method includes forming a trench in a metal layer overlying a substrate, depositing metal material in the trench and untreated or partially treated metal precursor on top of the metal material, planarizing the untreated or partially treated metal precursor within the trench, depositing a dielectric layer on the untreated or partially treated metal precursor, etching contact vias to an upper surface of the untreated or partially treated metal precursor, and depositing contact material within the contact vias to form contacts.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 5A and 5B are diagrams illustrating a contact formation of a contact within the antifuse structure shown in FIG. 1 that can be implemented within alternative embodiments of the present invention.

DETAILED DESCRIPTION

Figure 1:
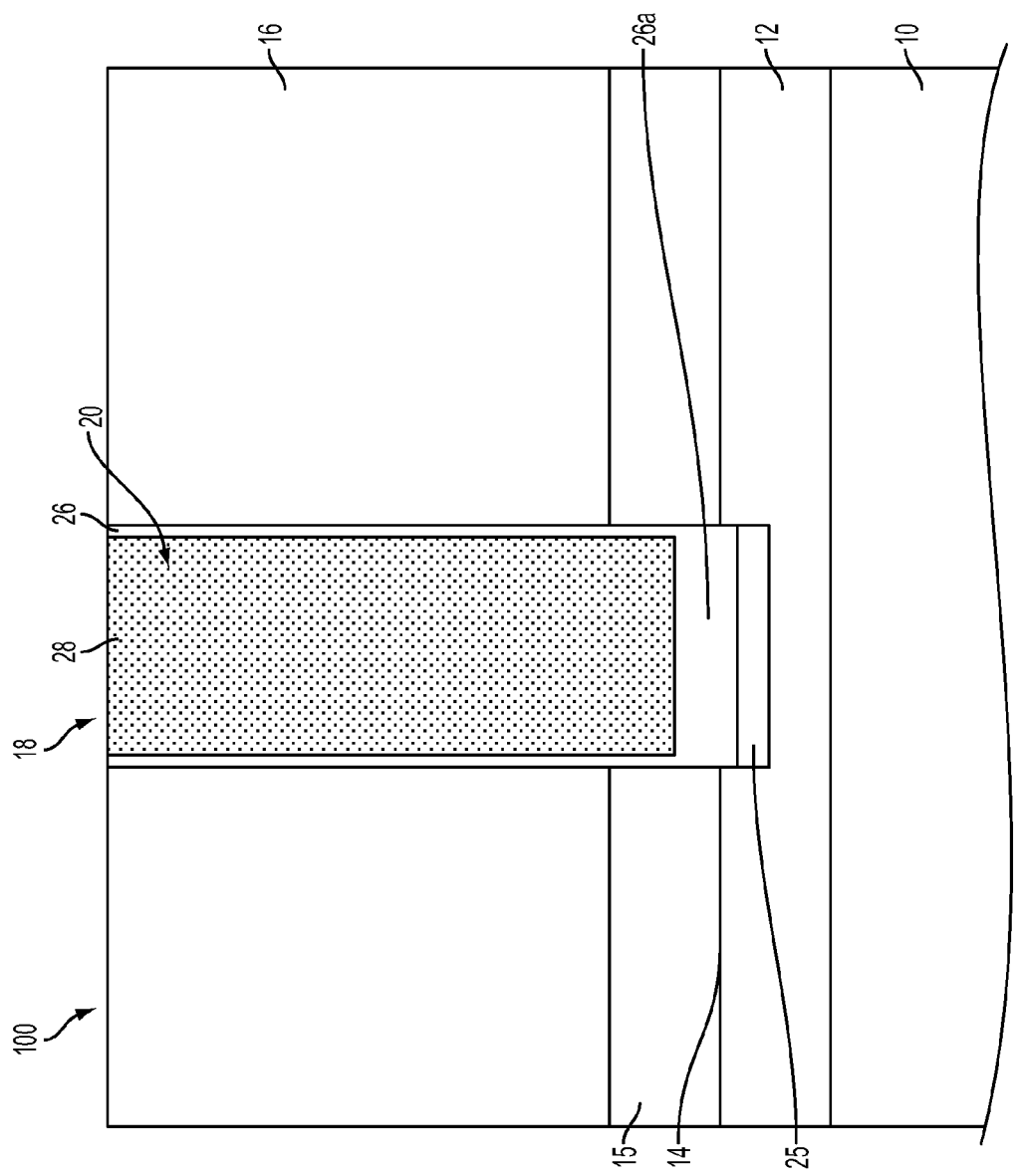
FIG. 1 is a diagram illustrating of an antifuse structure that can be implemented within embodiments of the present invention.

According to an embodiment of the present invention, an antifuse structure is provided that can be implemented within embodiments of the present invention. As shown in FIG. 1, the antifuse structure 100 includes a substrate 10 and a metal layer 12 overlying the substrate 10. The present invention may be implemented in other technologies, for example, write once read only memory. The metal layer 12 may be a silicide containing material such as a metal silicide, a metal silicide-metal germanide alloy, or a metal silicide-metal carbide alloy. The metal layer 12 has a thickness ranging from approximately 10-50 nanometers (nm).

Further in FIG. 1, a capping layer 15 is deposited at an upper surface 14 of the metal layer 12 and planarized by conventional deposition and planarization procedures. The capping layer 15 may be formed of silicon nitride (SiN), for example. A dielectric layer 16 is deposited on the capping layer 15. The dielectric layer 16 may be formed of silicon dioxide ($SiO_2$). A metal-filled contact 18 is formed within the capping layer 15 and the dielectric layer 16. Details regarding the formation of the contact 18 will now be described with reference to FIGS. 1 through 5B.

Figure 2A:
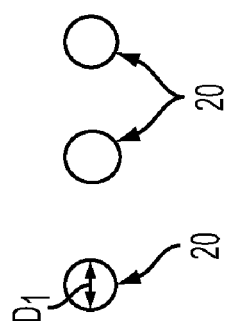
FIGS. 2A and 2B are diagrams respectively illustrating contact via diameters of the contact via shown in FIG. 1 according to an embodiment of the present invention and that of the conventional art.
Figure 2B:
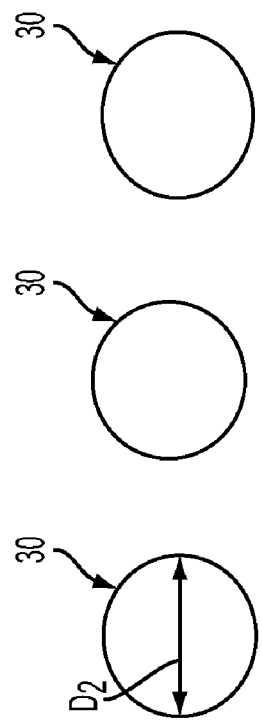

Referring now to FIG. 1, a contact via 20 is etched through a dielectric layer 16, the capping layer 15 and into the metal layer 12 by conventional lithographic and etching processes. Referring to FIGS. 2A and 2B, according to an embodiment of the present invention, the diameter $D_1$ of the contact via 20 is approximately one half of the diameter $D_2$ of a conventional contact via 30 as shown in FIG. 2B. For example, if diameter $D_2$ of the conventional contact via 30 is approximately 90 nanometers (nm), then the diameter $D_1$ of the contact via 20 is approximately 40-45 nanometers (nm). According to an embodiment of the present invention, the diameter $D_1$ of the contact via 20 ranges from between approximately 10 to 200 nanometers (nm), preferably approximately 40 to 60 nanometers (nm). Therefore, the contact via 20 is considered to be an undersized contact via in comparison to that of the conventional art. According to an embodiment of the present invention, the undersized contact via 20 may be formed by a different photo mask or by having less exposure to generate the undersized contact via 20. The undersized contact via 20 may alternatively be used in a fuse structure. According to an embodiment of the present invention, a semiconductor device may comprise both regular-sized contacts and undersized contacts.

Further in FIG. 1, a metal material 25 is deposited into the bottom of the contact via 20. A metal precursor 26 is then deposited into the contact via 20 on top of the metal material 25. The metal precursor 26 includes both a metal material and an organic carrier material. According to an embodiment of the present invention, the metal material 25 and the metal material included in the metal precursor 26 may be for example, titanium (Ti), tantalum (Ta), cobalt (Co), nickel (Ni), tungsten (W), chromium (Cr), molybdenum (Mo), rhenium (Re), or platinum (Pt) or other transition metal or rare earth metal. The metal precursor 26 is deposited in the contact via 20 by a chemical vapor deposition (CVD) process thereby evaporating the organic carrier material and leaving the metal material of the metal precursor 26 in the metal layer 12. This process is performed at a temperature of approximately 400 degrees Celsius. The metal material and any residual carbon containing material is then treated by an N2/H2 plasma to break a bond of the metal material and the carbon containing material. If the contact 18 is formed in a regular-sized contact via 30 then the treatment breaks the bond between the metal material and the carbon containing material resulting in the metal material remaining in the metal layer 12. If the contact 18 is formed in an undersized contact via 20 then the metal precursor 26 may remain untreated or only be partially treated by the N2/H2; therefore, some of the residual carbon containing material remains attached to a portion of the metal material at the metal layer 12, thereby leaving untreated or partially treated metal precursor 26a at an upper surface of the metal material 25 and forming a high resistive material. According to an embodiment of the present invention, the metal material 25 is of a predetermined thickness ranging from approximately 2 to 5 nanometers (nm) and the untreated or partially treated metal precursor 26a is of a predetermined thickness ranging from approximately 10 nanometers (nm) to approximately 20 nanometers (nm).

Upon applying a large programming current through that material, the bond is broken between the metal material and the organic carrier material to place the antifuse structure 100 in a low resistance state. According to an embodiment of the present invention, a voltage is applied to the antifuse structure 100 to make the antifuse structure 100 conductive. The voltage ranges from approximately 2 volts (V) to approximately 20 volts (V), for example.

Contact material 28 such as tungsten (W) is then deposited within the contact via 20 to form the contact 18.

Figure 3C:
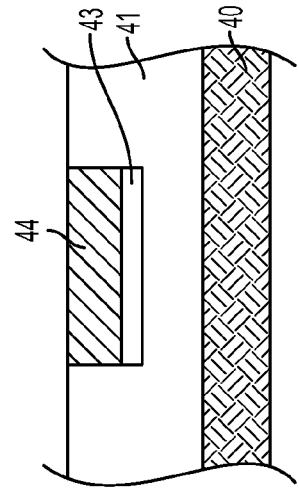
FIGS. 3A and 3D are diagrams illustrating a contact formation of a plurality of contacts within the antifuse structure shown in FIG. 1 that can be implemented within alternative embodiments of the present invention.
Figure 3D:
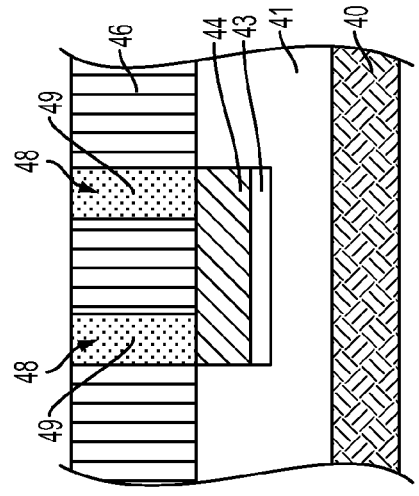
Figure 3A:
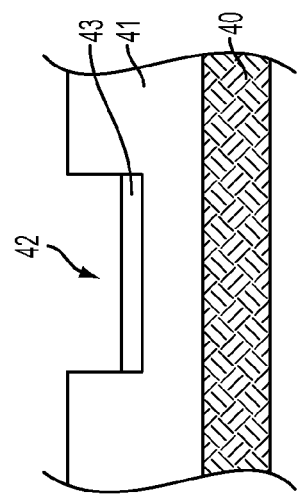
Figure 3B:
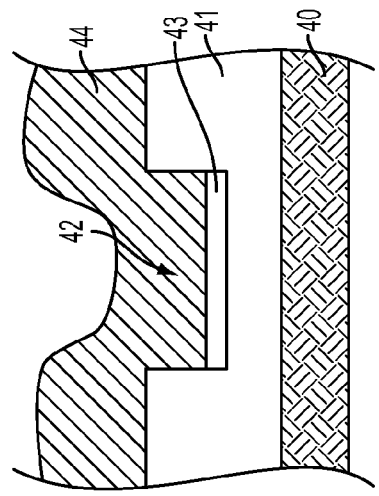

FIGS. 3A through 3D are diagrams illustrating a contact formation of an antifuse structure that can be implemented within alternative embodiments of the present invention. As shown in FIG. 3A, a trench 42 is formed in a metal layer 41 over a substrate 40. In FIG. 3B, the trench 40 is filled with a metal material 43 and an untreated or partially treated metal precursor 44 such as CVD titanium nitride (TiN) precursor. The present invention is not limited to the use of CVD TiN and any other untreated or partially treated metal precursor suitable for the purpose set forth herein may be used. According to an embodiment of the present invention, the metal material 43 is of a predetermined thickness ranging from approximately 2 to 5 nanometers (nm) and the untreated metal precursor 44 is of a predetermined thickness ranging from approximately 10 nanometers (nm) to approximately 20 nanometers (nm).

In FIG. 3C, the untreated or partially treated metal precursor 44 is planarized via a chemical mechanical polishing (CMP) process, for example. In FIG. 3D, a dielectric layer 46 is deposited on an upper surface of the untreated or partially treated metal precursor 44 and a plurality of contact vias 48 are formed to the upper surface of the trench 42 and contacting the untreated or partially treated metal precursor 44 and filled with a contact material 49 such as tungsten (W).

Figure 4A:
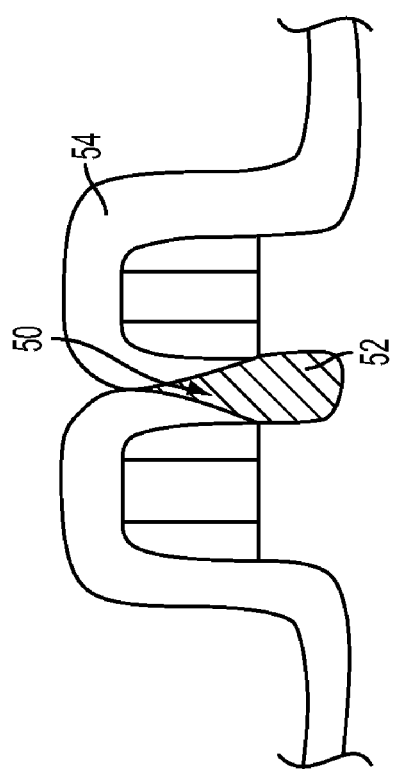
FIGS. 4A and 4B are diagrams illustrating a contact formation of a plurality of contacts within the antifuse structure shown in FIG. 1 that can be implemented within alternative embodiments of the present invention.
Figure 4B:
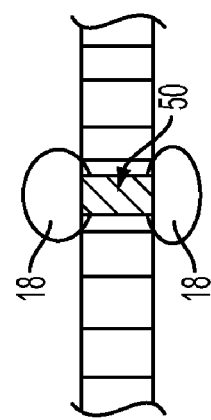

FIGS. 4A and 4B are diagrams illustrating a contact formation of a plurality of the contacts within the antifuse structure shown in FIG. 1 that can be implemented within alternative embodiments of the present invention. In FIGS. 4A and 4B, a sub-way tunnel of untreated or partially treated metal precursor is formed between a plurality of contacts 18 according to an embodiment of the present invention. As shown in FIGS. 4A and 4B, a tunnel 50 is formed between a plurality of contacts 18, the tunnel 50 is filled with untreated or partially treated metal precursor 52 such as untreated CVD TiN. An insulating layer 54 such as silicon nitride (SiN) is formed over the contacts 18. The insulating layer 54 may be formed of a predetermined thickness ranging from approximately 50 nanometers (nm) to approximately 500 nanometers (nm). When a large programming current is applied to the antifuse structure 100, the structure 100 is in a low resistive state and becomes conductive to send signals.

FIGS. 5A and 5B are diagrams illustrating a contact formation of an antifuse structure that can be implemented within alternative embodiments of the present invention. As shown in FIG. 5A, a contact via 60 is formed to an upper surface of a silicon substrate 62 having an overlying silicide layer 64 and a dielectric layer 65 formed over the silicide layer 64, for example. FIG. 5B is an exploded view of section A' showing the details of the contact via 60 in FIG. 5A. In FIG. 5B, a sputtering process is performed to clean a bottom of the contact via 60. Then, a metal material 66 is deposited within the contact via 60. The metal material 66 may be titanium (Ti) however, the present invention is not limited hereto and any other material suitable for the purpose set forth herein may be used. The metal material 66 may be tantalum (Ta), cobalt (Co), nickel (Ni), tungsten (W), chromium (Cr), molybdenum (Mo), rhenium (Re), or platinum (Pt) or other transition metal or rare earth metal. Next, a treated metal precursor 68 such as treated CVD TiN may be deposited on the metal material 66. The treated metal precursor 68 may have a predetermined thickness ranging from approximately 1 nanometer (nm) to approximately 10 nanometers (nm). Untreated or partially treated metal precursor 70 is then deposited. According to an embodiment of the present invention, the untreated or partially treated metal precursor 70 may be CVD titanium nitride (TiN). The untreated metal precursor 70 may have a predetermined thickness ranging from approximately 1 nanometer (nm) to approximately 20 nanometers (nm). The untreated or partially treated metal precursor 70 may be formed of the same metal material as the metal material 66. The metal material may be titanium (Ti). Next, treated metal precursor 68 may be deposited on the untreated or partially treated metal precursor 70. The contact via 60 is then filled with a contact material 72 such as tungsten (W) to form a metal-filled contact 18.

Embodiments of the present invention provide the advantages of using untreated metal precursor at the bottom surface of a contact via of each contact, thereby causing the contact to be resistive. By applying a large programming current, localized heat breaks the bond of metal and the organic carrier material, therefore resulting in a low resistance programming state causing the contact to be conductive.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. An antifuse structure comprising:
   a substrate having an overlying metal layer;
   a plurality of contacts formed to the metal layer; and
   a tunnel formed between the plurality of contacts and filled with an untreated or partially treated metal precursor.

2. The antifuse structure of claim 1, wherein the untreated or partially treated metal precursor comprises a metal material from a group including titanium (Ti), tantalum (Ta), cobalt (Co), nickel (Ni), tungsten (W), chromium (Cr), molybdenum (Mo), rhenium (Re), or platinum (Pt), other transition metal and rare earth metal.

* * * * *